United States Patent
Carpenter

(10) Patent No.: US 12,272,895 B2
(45) Date of Patent: Apr. 8, 2025

(54) RECESSED D-SUBMINIATURE CONNECTOR ASSEMBLY WITH FLUSH MOUNT COVER

(71) Applicant: Northgate Technologies Inc., Elgin, IL (US)

(72) Inventor: Scott Carpenter, Elgin, IL (US)

(73) Assignee: Northgate Technologies Inc., Elgin, IL (US)

( * ) Notice: Subject to any disclaimer, the term of this patent is extended or adjusted under 35 U.S.C. 154(b) by 0 days.

(21) Appl. No.: 18/644,552

(22) Filed: Apr. 24, 2024

(65) Prior Publication Data

US 2024/0347960 A1    Oct. 17, 2024

Related U.S. Application Data

(63) Continuation of application No. 17/484,923, filed on Sep. 24, 2021, now Pat. No. 11,996,649.

(60) Provisional application No. 63/083,497, filed on Sep. 25, 2020.

(51) Int. Cl.
| | |
|---|---|
| *H01R 13/502* | (2006.01) |
| *H01R 12/70* | (2011.01) |
| *H01R 13/52* | (2006.01) |
| *H01R 13/629* | (2006.01) |

(52) U.S. Cl.
CPC ........ *H01R 13/502* (2013.01); *H01R 12/7047* (2013.01); *H01R 13/5213* (2013.01); *H01R 13/629* (2013.01)

(58) Field of Classification Search
CPC .............. H01R 13/502; H01R 12/7047; H01R 13/5213; H01R 13/629
See application file for complete search history.

(56) References Cited

U.S. PATENT DOCUMENTS

| | | | |
|---|---|---|---|
| 4,241,972 A | 12/1980 | Ayer | |
| 4,312,558 A | 1/1982 | Duerr et al. | |
| 5,391,091 A * | 2/1995 | Nations | H01R 12/7047 439/378 |
| 5,709,569 A | 1/1998 | Buck et al. | |

(Continued)

OTHER PUBLICATIONS

Switchcraft Inc., Customer Drawing, E Series D-Sub Connector, RoHS D-Sub, Part No. EHDB9 & EHHD15 Seried, Sep. 28, 2006 (1 page).

(Continued)

*Primary Examiner* — Abdullah A Riyami
*Assistant Examiner* — Nader J Alhawamdeh
(74) *Attorney, Agent, or Firm* — Crowell & Moring LLP

(57) ABSTRACT

A recessed D-subminiature connector assembly, and device with D-subminiature connector assembly, with flush mount cover connector is disclosed. The D-subminiature connector assembly may include a flush panel mount solution when using a D-Sub connector that allows the dust cover or cap to be in the same plane as the external side of the panel it is mounted to. The D-subminiature connector assembly also includes a panel-side interface flange sized to receive the second side of the D-shaped connector so a surface of the second side of the D-Shaped connector is parallel to, and recessed from, a plane of the panel-side interface flange and thus recessed from an opening of a panel of a device to which the connector assembly is mounted.

27 Claims, 17 Drawing Sheets

(56) References Cited

U.S. PATENT DOCUMENTS

| | | | | |
|---|---|---|---|---|
| 5,755,592 | A * | 5/1998 | Hillbish | H01R 12/7064 |
| | | | | 439/541.5 |
| 5,980,313 | A | 11/1999 | Kunishi et al. | |
| 6,238,242 | B1 | 5/2001 | Hwang | |
| 9,331,405 | B2 * | 5/2016 | Tsang | H01R 12/7047 |
| 2008/0188139 | A1 * | 8/2008 | Poulin | H01R 9/24 |
| | | | | 439/686 |
| 2009/0149073 | A1 * | 6/2009 | Xiang | H01R 13/6595 |
| | | | | 439/638 |
| 2009/0221187 | A1 * | 9/2009 | Daly | H01R 31/06 |
| | | | | 439/660 |
| 2012/0196473 | A1 | 8/2012 | Foung | |

OTHER PUBLICATIONS

Neutrik, NADB9FF-B, 9 pole D-SUB feedthrough, female to female, black D shape housing, believed to have been publicly available prior to Sep. 25, 2020 (2 pages).

Cliff Electronic Components Limited, VGA Connector, Part No. CP30229BM Aug. 2019 (1 page).

* cited by examiner

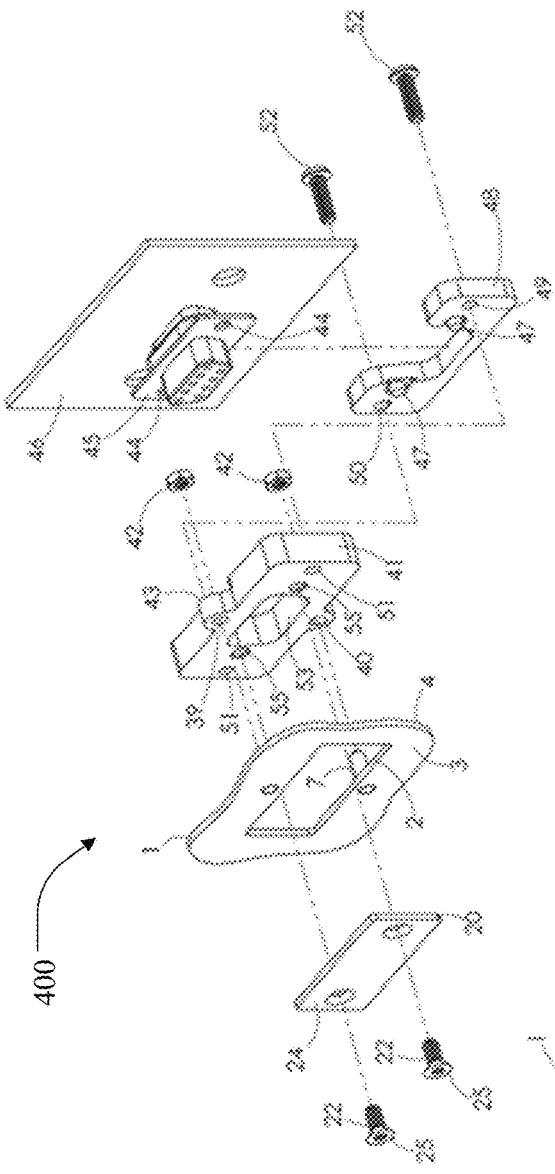

FIG. 15
FIG. 16
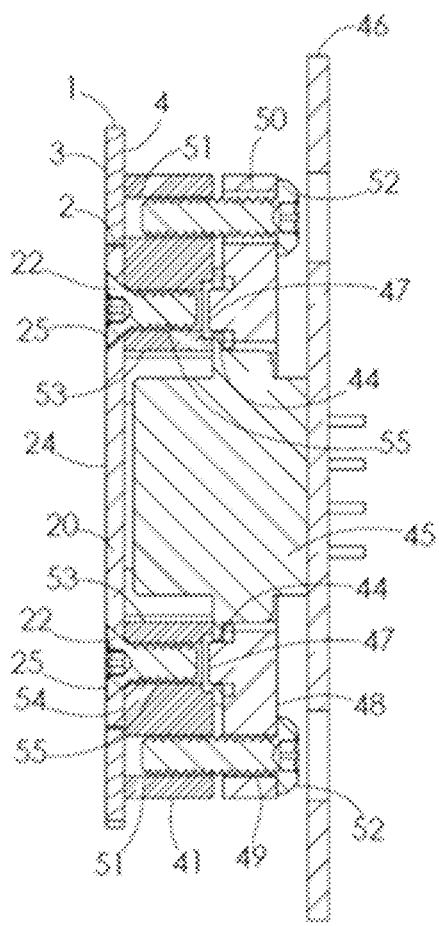
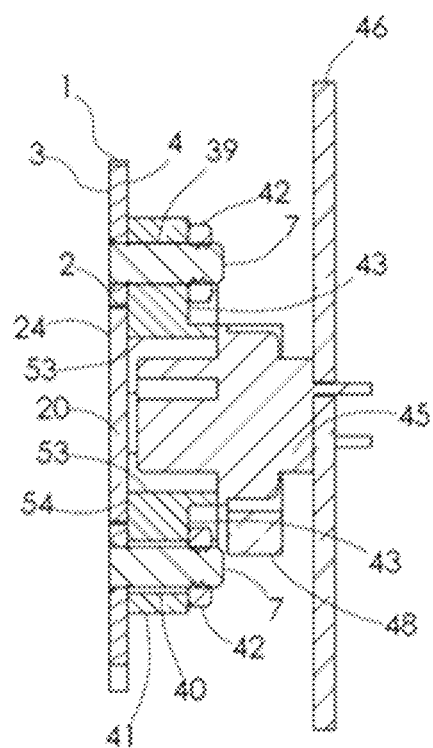

RECESSED D-SUBMINIATURE CONNECTOR ASSEMBLY WITH FLUSH MOUNT COVER

CROSS-REFERENCE TO RELATED APPLICATIONS

This application is a continuation of U.S. Non-Provisional patent application Ser. No. 17/484,923, filed Sep. 24, 2021, pending, which claims the benefit of U.S. Provisional Application No. 63/083,497, filed Sep. 25, 2020, expired, the entireties of which are hereby incorporated by reference herein.

FIELD OF THE DISCLOSURE

The present disclosure relates to device mounted electrical connectors and, more particularly, to an electrical connector assembly for panel and printed circuit board mounting arrangements.

BACKGROUND

A D-Subminiature (D-Sub) connector is a common type of electrical connector named for its D-shaped metal shield. Contained within the metal shield are two or more rows of pins. The metal shield provides correct alignment, electromagnetic shielding, and mechanical stability for the mating D-Sub connector.

D-Sub connectors protrude through the panels in which they are ultimately assembled. This is true for both the panel mounted style (when the D-Sub is used in an electrical harness) and the PCB (Printed Circuit Board) mounted style (when the D-Sub is mounted directly to a PCB). When both styles are fully assembled to a panel, the D-shaped metal shield protrudes through the panel, resulting in a non-flush condition. An example of may be seen in FIG. 31 showing a standard back panel 801 of the housing 802 of an electronic device 800 with D-Sub connectors 803 and other connectors protruding out.

Panel mounted D-Sub connectors typically require jack screws 804 to hold the D-Sub connector against the panel. A jack screw has an external thread on one end and an internal thread with hex on the opposite end. The external thread of the jack screw assembles into a mating internal thread on the D-Sub connector, or to a nut on the back side of the D-Sub connector.

PCB mounted D-Sub connectors also typically require the use of jack screws. When the D-Sub connector is mounted to a PCB, the jack screws are not used for mechanical support of the D-Sub connector. Instead, the primary use of the jack screws is to mechanically fasten the mating D-Sub connector harness.

Both D-Sub connector styles (panel and PCB mounted) are designed to be mechanically fastened to the mating D-Sub connector harness using the jack screws. This provides strain relief for the mating D-Sub connector harness and ensures that the electrical connection is not disrupted. The mating D-Sub connector harness will typically have two external threaded posts that assemble into the two internal threaded with hex ends of the jack screws. The jack screws are assembled from the outside of the panel with the external threaded end of the jack screw going through a hole or slot in the panel and assembling into the internal thread of the D-Sub connector. This pulls the D-Sub connector up against the inside of the panel. The jack screws 804 also protrude out past the back of the panel, similar to the D-shaped metal shield of the D-Sub connector, also resulting in a non-flush condition.

The protrusion of the metal shield of the D-Sub connector and the jack screws out past the panel may not be desirable in applications that require a flush to the panel design requirement. Such as for, regulatory, safety, or other design related requirements.

Certain product or device specifications require that external type electrical connectors must be covered. These covers can also have requirements specifying that they cannot be easily removed and must be fastened or assembled to the device. Further requirements may also specify that a tool must be used to remove the cover to gain access to the connector.

There are many types of covers for D-Sub connectors, typically referred to as dust covers or caps. These dust covers come in many different shapes and materials, such as, plastic, rubber, and metal. In all cases, the dust covers are designed to assemble to the protruding portion of the D-Sub metal shield and/or the jack screws. An example standard protruding D-Sub connector 803 and removable plastic dust cover 805 can be seen in FIG. 32. These type of dust covers also protrude past the back of the panel. In the case of some metal dust covers, they may be assembled to the internal threaded with hex ends of the jack screws leaving the thin metal edges of the dust cover raised away from the panel. For products/devices that need to be handled or moved by an operator, external protruding features, especially those with metal edges have the potential to harm the operator.

SUMMARY

In order to provide an improved connector mounting arrangement, including one that can avoid sharp edges or protrusions that can catch on a person, wires or equipment, recessed connector assemblies and flush mounted cover panel designs are described herein.

The disclosed connectors and covers may provide a recessed D-Sub connector which allows for a flush to the panel mount design, as well as providing a flush to the panel cover that may reduce the risk of users cutting themselves on sharp edges protruding out past the panel. The disclosed designs also provide a solution where a non-protruding connector port is desirable or required. The recessed D-subminiature connector with flush mount cover described herein provides a flush panel mount solution when using a D-Sub connector.

Also disclosed is a locking cover restricting access to the connection port. The flush mounted design allows the dust cover or cap to be in the same plane as the external side of the panel it's mounted to. This feature can reduce or eliminate possible hazards from a user injuring themselves when grabbing onto a device/product with a raised and protruding dust cover. The cover may also be assembled with a tool to restrict access.

According to one aspect, a D-shaped connector assembly for installation in an opening of a panel of a device is provided. The D-shaped connector assembly may include a D-shaped connector body having a plurality of conducting leads located on a first side and a plurality of connector pin receptacles positioned on a second side. The D-shaped connector assembly may also include a panel-side interface flange having an opening sized to receive the second side of the D-shaped connector and wherein a surface of the second side of the D-Shaped connector body is parallel to, and recessed from, a plane of the panel-side interface flange, when the D-shaped connector body is connected to the panel-side interface flange and attached to the panel in the opening of the panel of the device. A connector cover is removably attachable over the D-shaped connector body in a recessed region defined by the opening of the panel and the panel-side interface flange attached to the device such that, in an attached position, the connector cover is substantially flush with an outer surface of the panel of the device.

According to another aspect, a device having a recessed D-shaped connector assembly includes a device housing having a panel defining a connector opening and a D-shaped connector mounted to the panel at the connector opening, wherein the D-shaped connector comprises a D-shaped connector body having a plurality of conducting leads located on a first side and a plurality of connector pin receptacles positioned on a second side. The device also includes a panel-side interface flange having an opening sized to receive the second side of the D-shaped connector. A surface of the second side of the D-Shaped connector is parallel to, and recessed from, a plane of the panel-side interface flange, when the D-shaped connector body is connected to the panel-side interface flange and attached to the housing adjacent the connector opening in the panel such that the second side of the D-Shaped connector is maintained in a position recessed from the connector opening.

Other embodiments are contemplated and described herein.

BRIEF DESCRIPTION OF THE DRAWINGS

For the purpose of facilitating an understanding of the subject matter sought to be protected, there is illustrated in the accompanying drawings an embodiment thereof, from an inspection of which, when considered in connection with the following description, the subject matter sought to be protected, its construction and operation, and many of its advantages should be readily understood and appreciated.

FIG. 13 is a front perspective exploded view of the recessed D-subminiature connector assembly with flush mount cover of FIG. 11.

FIG. 14 is a rear perspective exploded view of the recessed D-subminiature connector assembly with flush mount cover of FIG. 11.

FIG. 15 is a top cross-sectional view of the recessed D-subminiature connector assembly of FIG. 11.

FIG. 16 is a side cross-sectional view of the recessed D-subminiature connector assembly of FIG. 11.

DETAILED DESCRIPTION

The present disclosure is directed to a connector assembly that incorporates non-protruding features, such as recessed and flush mount portions. For example, a recessed D-Subminiature (D-Sub) connector with flush mount cover is disclosed and described herein that provides a flush panel mount solution when using a D-Sub connector. The terms D-shaped connector or D-shaped connector assembly may also be used interchangeably with D-Sub herein. The flush mounted design allows the dust cover or cap to be in the same plane as the external side of the panel it's mounted to. This reduces any possible hazards from a user injuring themselves when grabbing onto a device/product with a raised and protruding dust cover. The disclosed cover may also be assembled with a tool to restrict access.

First Embodiment

Figure 1:
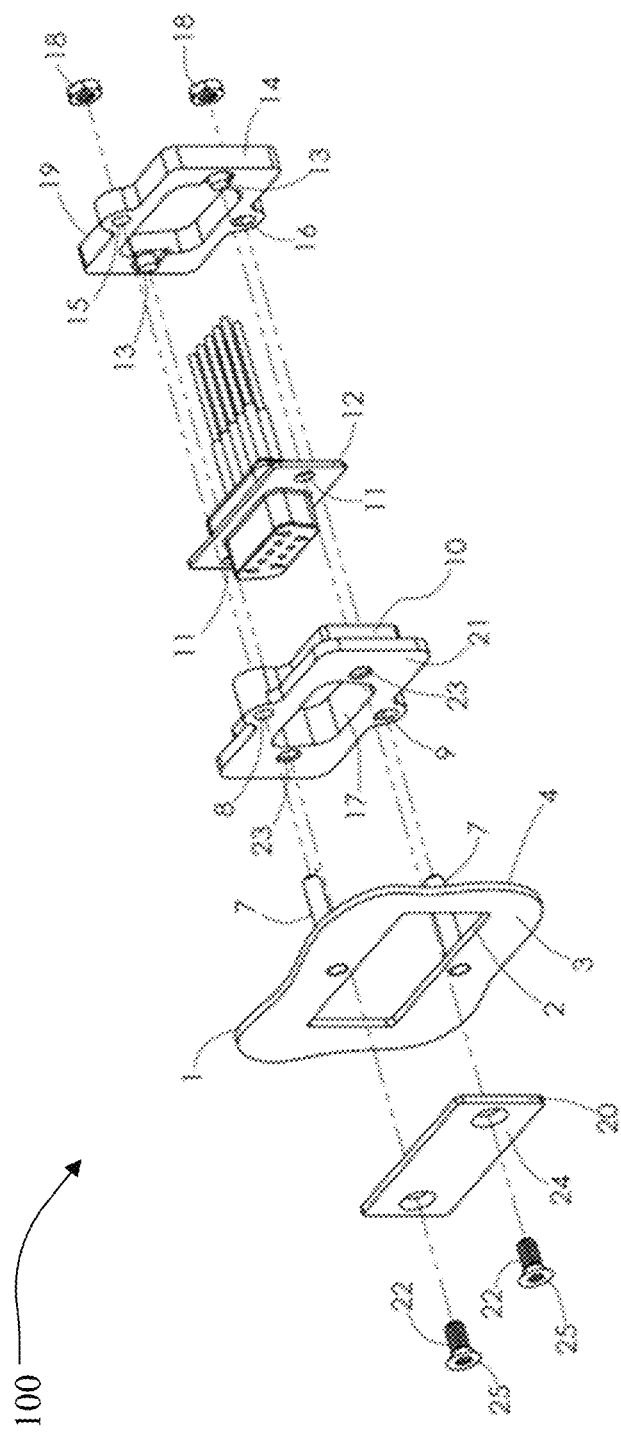
FIG. 1 illustrates an exploded view of a recessed D-subminiature connector assembly with flush mount cover according to an embodiment of the present invention.
Figure 2:
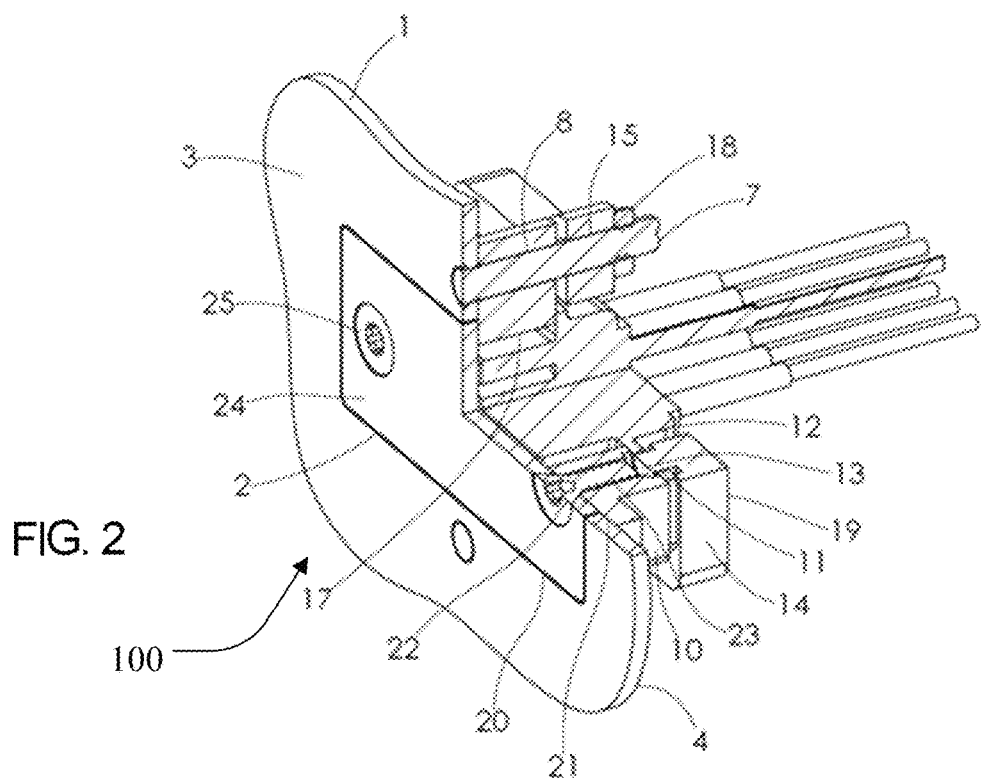
FIG. 2 is a sectional view of the recessed D-subminiature connector assembly with flush mount cover of FIG. 1.
Figure 3:
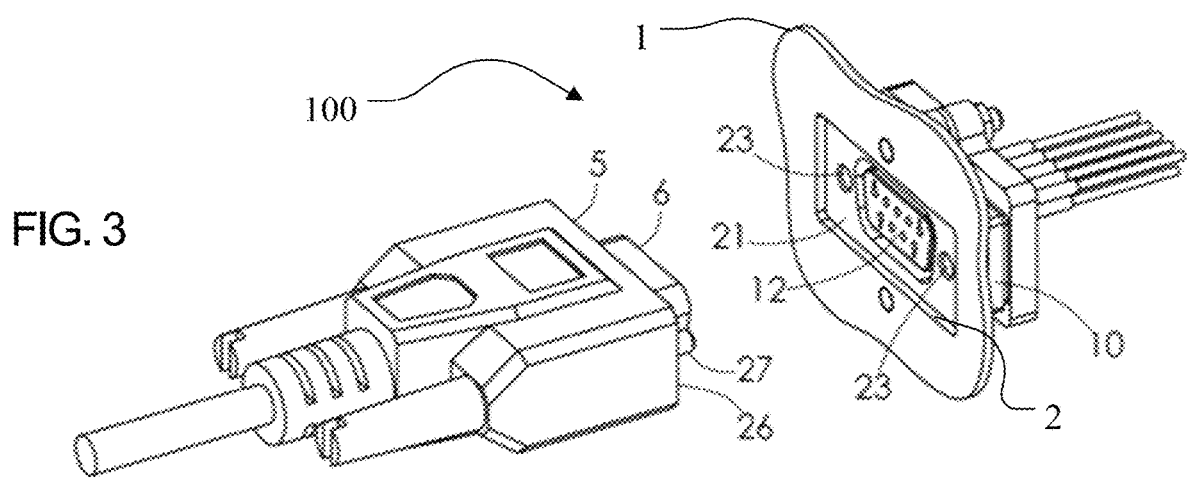
FIG. 3 shows the recessed D-subminiature connector assembly of FIG. 1 without the flush mount cover and aligned with a complementary male connector.
Figure 4:
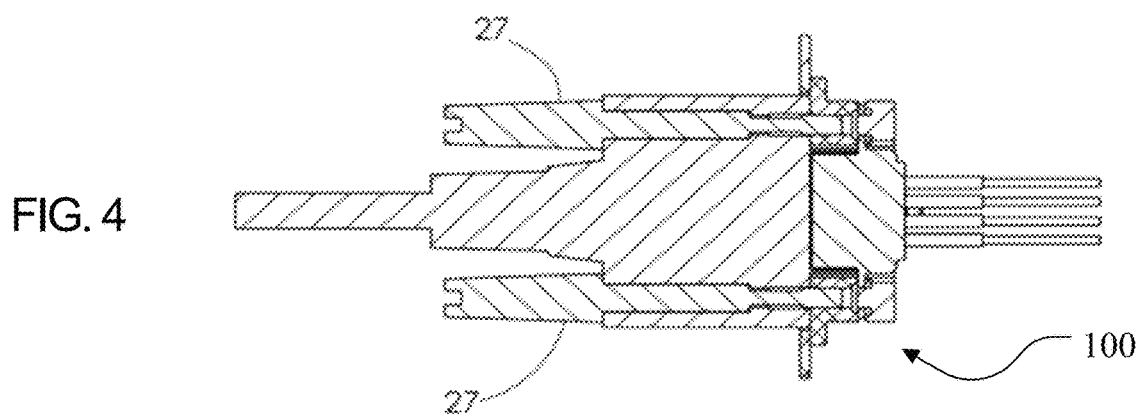
FIG. 4 shows a cross-sectional view of the recessed D-subminiature connector assembly and the complementary male connector of FIG. 3 in a connected configuration.

Referring to the of FIGS. 1-4, a first embodiment of a D-sub connector assembly 100 is shown. As shown in FIGS. 1-2, one example of a recessed D-Subminiature (D-Sub) connector assembly 100 mounted to a panel is shown. The panel 1 contains a panel opening 2 extending from the outside panel surface 3 to the inside panel surface 4. The panel opening 2 is large enough to accept the outside profile 5 of the mating D-Sub connector 6. The panel 1 may be the wall, or part of a wall, of a housing of an electronic device, for example a medical device. The panel 1 may be a metal or non-metal material and is only shown in partial or cutaway view for purposes of this explanation.

Threaded studs 7 are positioned outside the panel opening 2. The alignment hole 8 and alignment slot 9 on interface flange 10 mate with the threaded studs 7 on the panel 1. This provides the alignment of the interface flange 10 to the panel opening 2 as the interface flange 10 is positioned up against the inside panel surface 4. In different implementations, the interface flange 10 could also be positioned to the panel with other features on the panel or interface flange. For example, the panel 1 could have a recess to receive protrusions from the interface flange 10, or the interface flange 10 could have a recess to receive protrusions from the panel 1. These protrusions and recesses may be cylindrical, square, rectangular or any other type of feature in which alignment could be achieved between the panel 1 and interface flange 10.

The D-Sub holes 11 on the D-Sub connector 12 mate with the alignment posts 13 on the rear mount 14. This provides the alignment of the D-Sub connector 12 to the rear mount 14. In alternative implementations, the D-Sub connector could also be positioned to the rear mount with other features on the D-Sub connector, such as the perimeter feature of the D-Sub connector, or the backside "D" feature of the D-Sub connector.

The alignment hole 15 and alignment slot 16 on the rear mount 14 mate with the threaded studs 7 on the panel 1. This provides the alignment of the D-Sub connector 12 with rear mount 14 through the interface flange opening 17 to the panel opening 2. Nuts 18 are assembled to the threaded studs 7 and fastened up against the back 19 of the rear mount 14 mechanically fastening all the components up against the inside panel surface 4. Alternatively, the D-Sub connector could also be positioned to the interface flange with other features on the D-Sub connector or interface plate, such as an embodiment where the interface flange has protrusions to align with the D-Sub holes, or an embodiment where the interface flange has a recess to receive the perimeter feature of the D-Sub connector.

The cover 20 is placed in the panel opening 2 up against the inside surface 21 of interface flange 10. The cover 20 is assembled to the interface flange 10 with screws 22. The screws 22 mate with the internal threads 23 of the interface flange 10. After assembly, the outside surface 24 of the cover 20 is in the same plane as, or recessed inside, the outside panel surface 3. The screw heads 25 are in the same plane as or recessed below the outside surface 24 of the cover 20.

With the cover 20 and screws 22 removed, the mating D-Sub connector 6 can be inserted into the D-Sub connector 12. The mating D-Sub connector 6 is inserted into the D-Sub connector 12 until the outside surface 26 of the mating D-Sub connector 6 is flush with the inside surface 21 of the interface flange 10. Once fully inserted, the threaded posts 27 of the mating D-Sub connector 6 are fastened into the internal threads 23 of the interface flange 10. Although a particular D-Sub connector is shown, other size D-Sub connectors with different sizes and pin counts are contemplated, as are non-D-Sub connector types. Additionally, instead of pin receptacles on one side of the D-Sub connector, with a plurality of leads on the other, the D-Sub connector may in other embodiments instead have a plurality of pins on one side and the plurality of leads on the other. The connectors and materials for the assembly 100 do not require any specific material type. Any of a number of known material types, such as plastic or metal, may be implemented.

Second Embodiment

Figure 5:
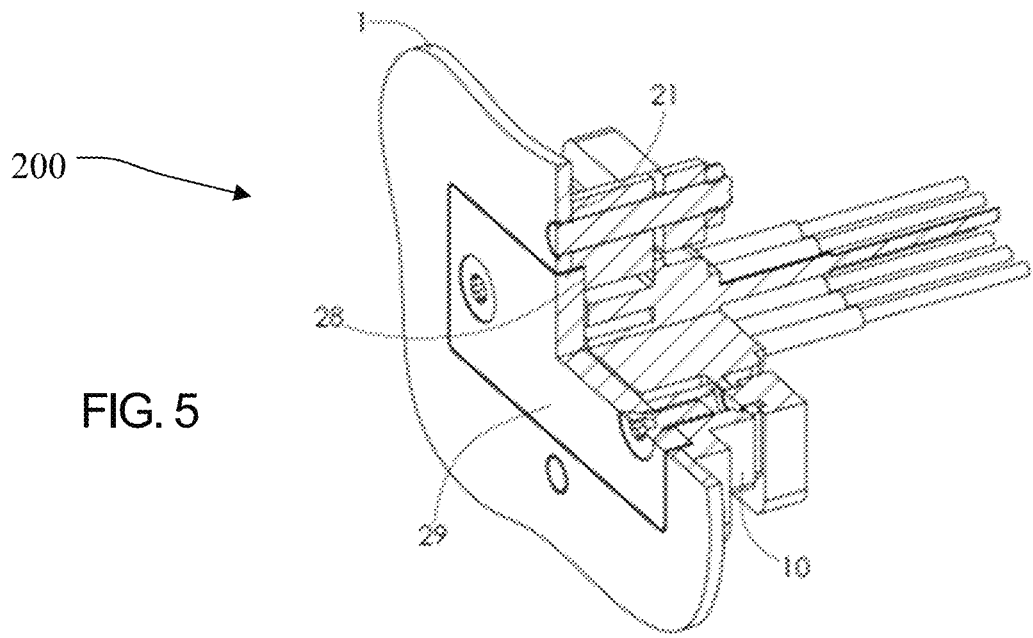
FIG. 5 is a sectional view of a second embodiment of the recessed D-subminiature connector assembly with flush mount cover of FIGS. 1-4.
Figure 6:
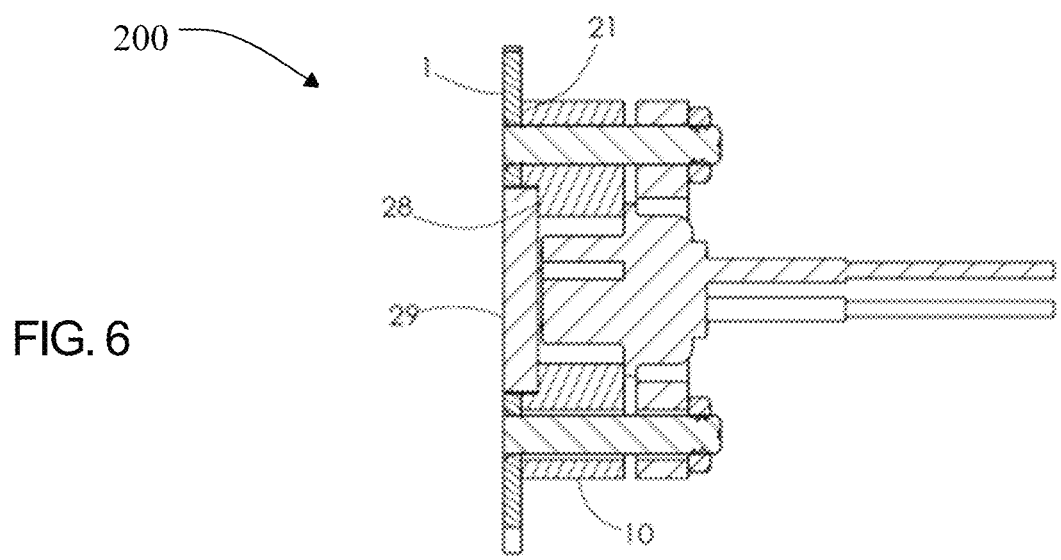
FIG. 6 shows a side cross-sectional view of the recessed D-subminiature connector assembly with flush mount cover of FIG. 5.
Figure 7:
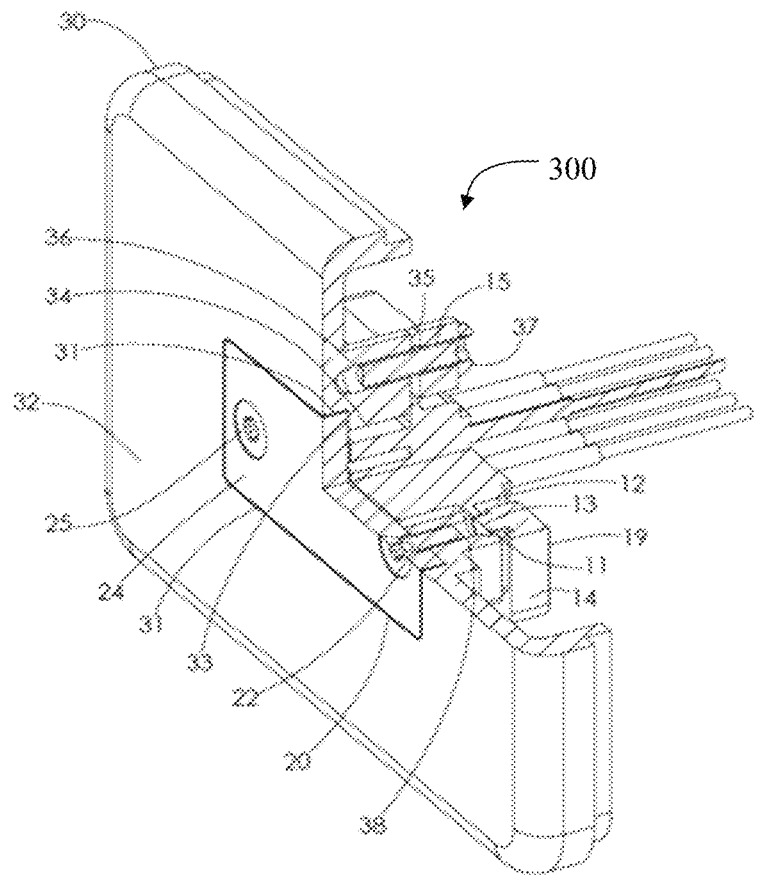
FIG. 7 shows a third embodiment of the recessed D-subminiature connector assembly with flush mount cover of FIG. 1.
Figure 8:
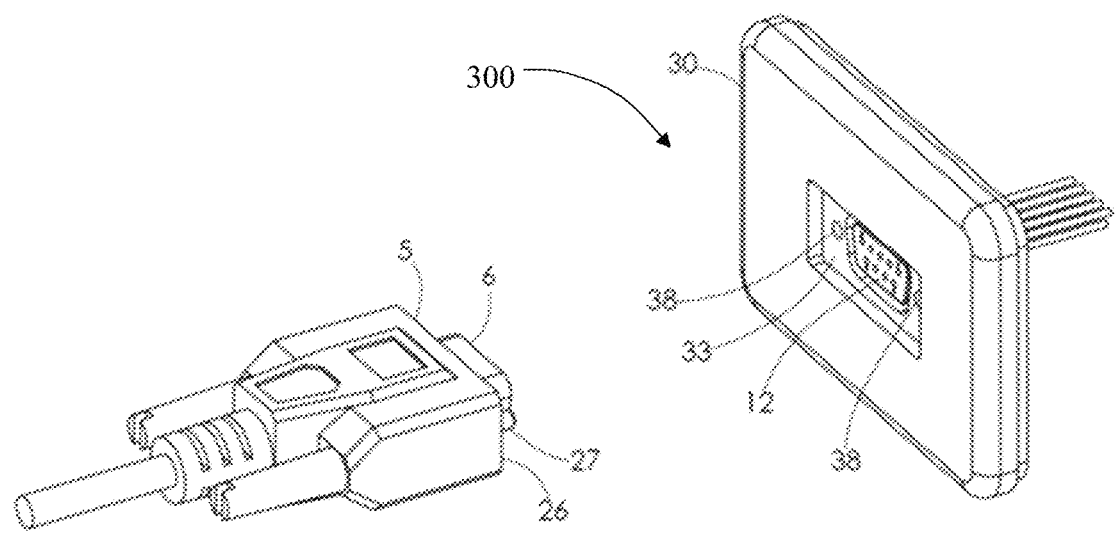
FIG. 8 shows the recessed D-subminiature connector assembly of FIG. 7 without the flush mount cover and aligned with a complementary male connector.
Figure 9:
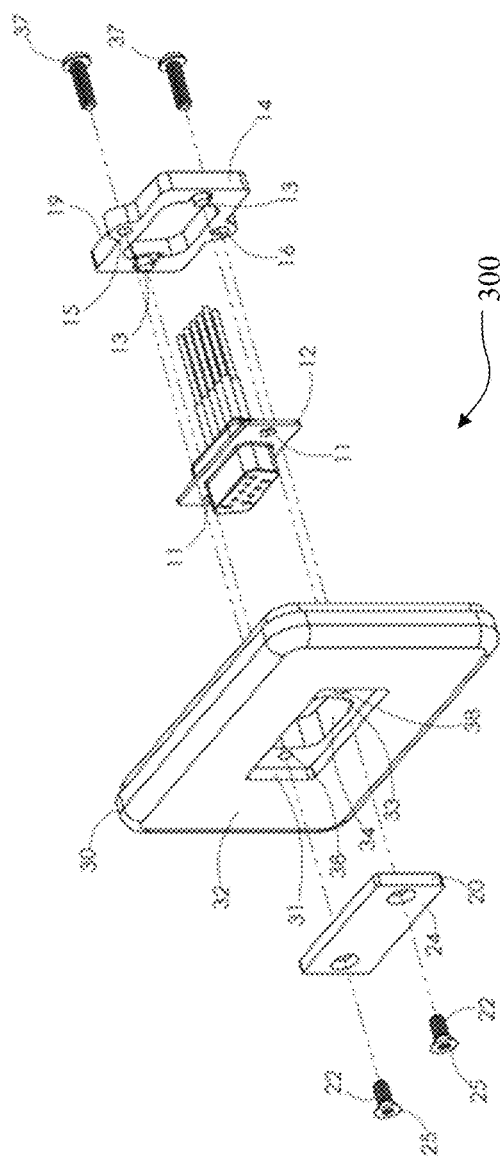
FIG. 9 is a front perspective exploded view of the recessed D-subminiature connector assembly with flush mount cover of FIG. 7.
Figure 10:
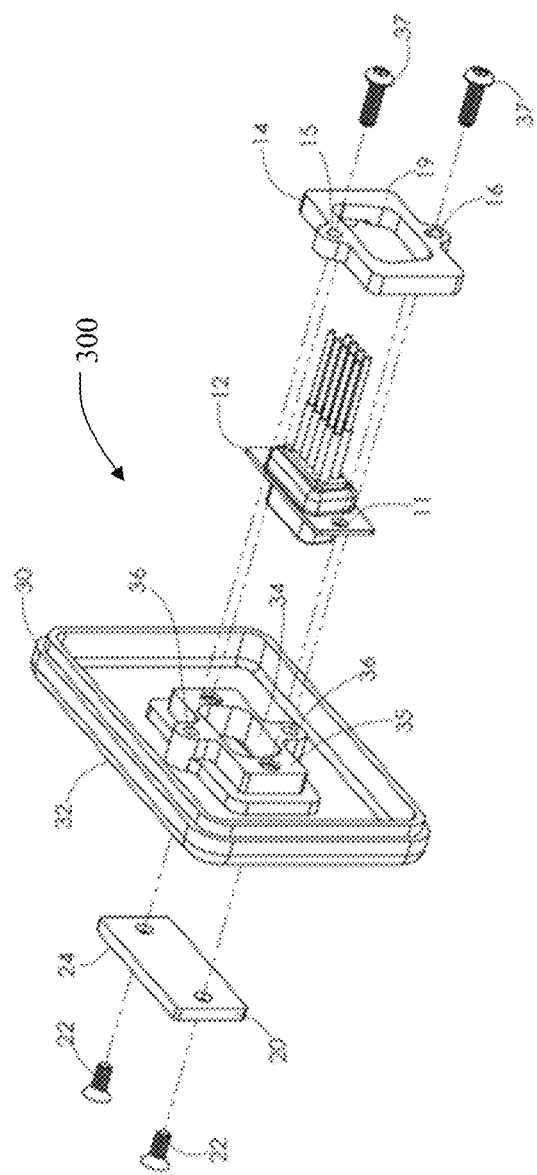
FIG. 10 is a rear perspective exploded view of the recessed D-subminiature connector assembly with flush mount cover of FIG. 7.
Figure 11:
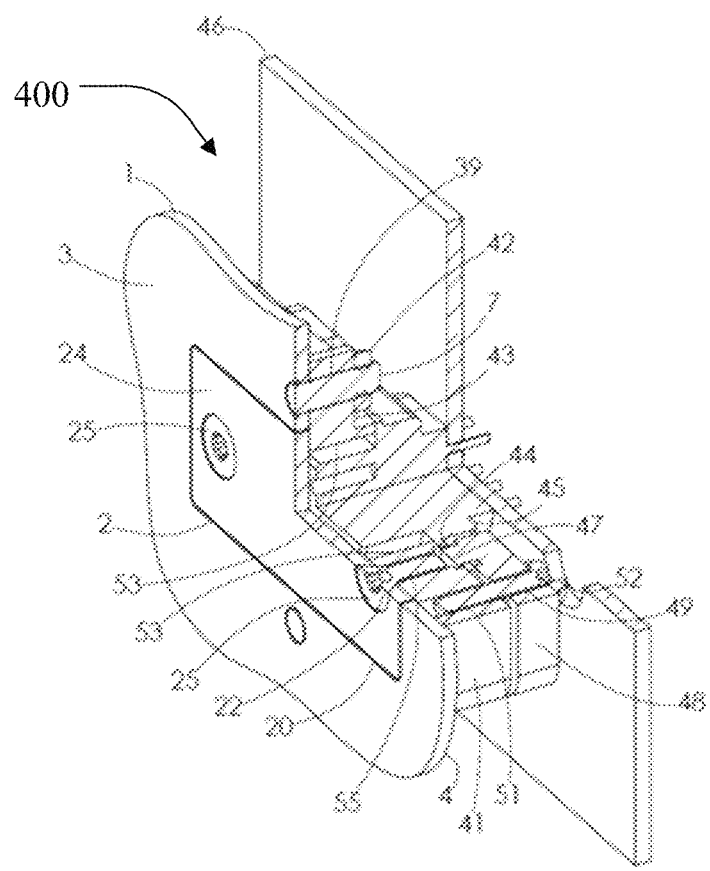
FIG. 11 shows a sectional view of a fourth embodiment of the recessed D-subminiature connector assembly with flush mount cover of FIG. 1.
Figure 12:
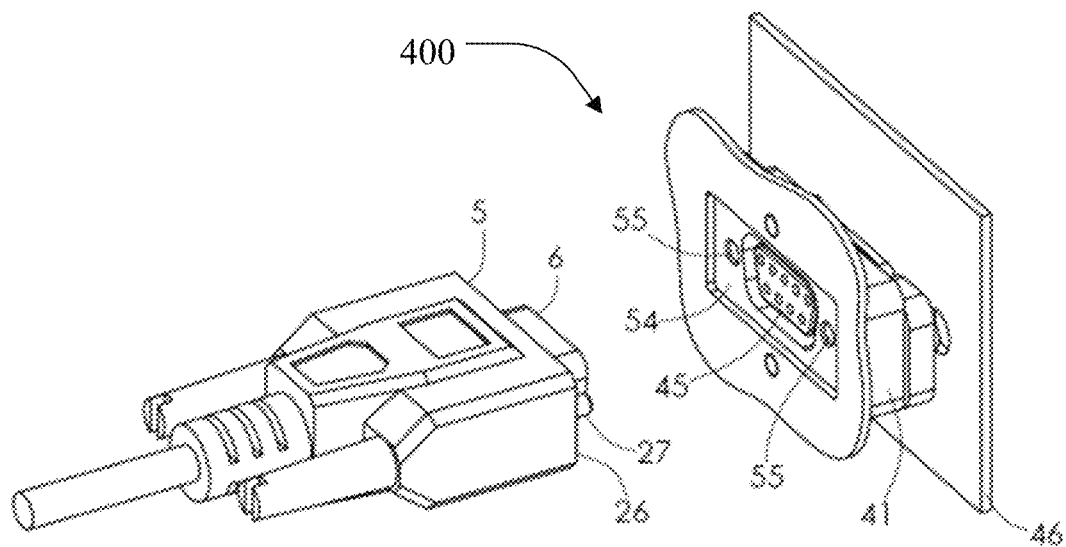
FIG. 12 shows the recessed D-subminiature connector assembly of FIG. 11 without the flush mount cover and aligned with a complementary male connector.
Figure 17:
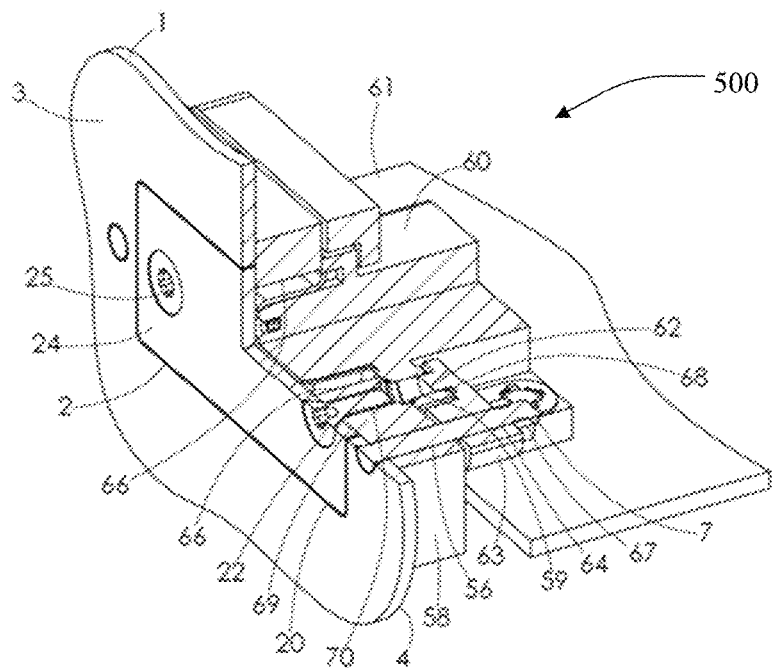
FIG. 17 illustrates a sectional view of a fifth embodiment of the recessed D-subminiature connector assembly with flush mount cover of FIG. 1.
Figure 18:
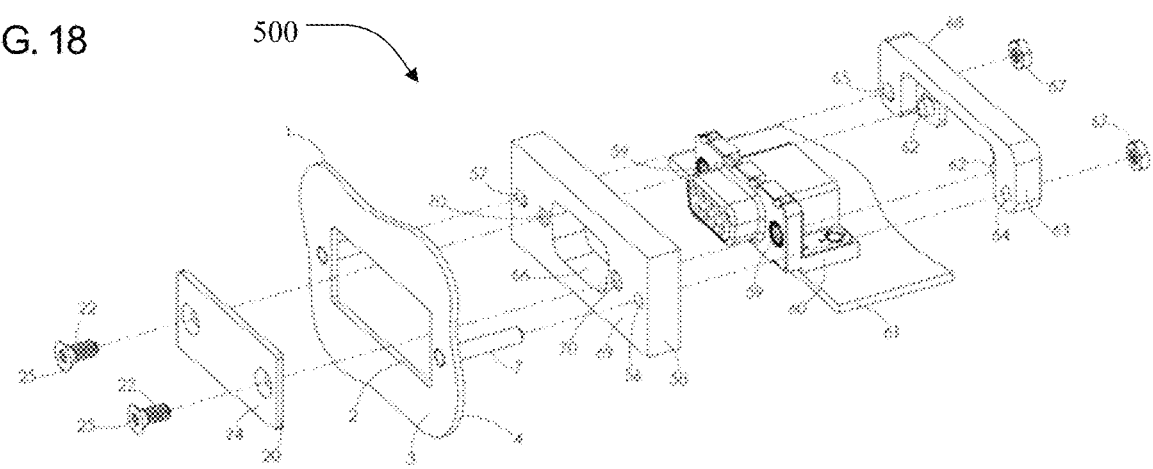
FIG. 18 illustrates an exploded view of the recessed D-subminiature connector assembly with flush mount cover of FIG. 17.
Figure 19:
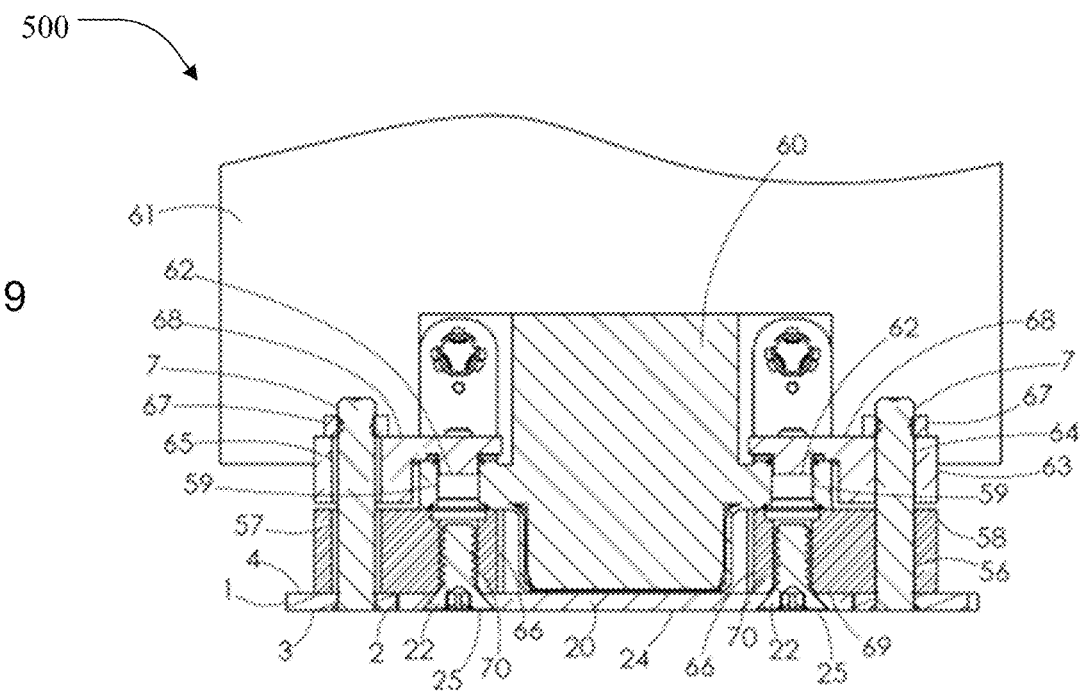
FIG. 19 is a top cross-sectional view of the recessed D-subminiature connector assembly of FIG. 17.
Figure 20:
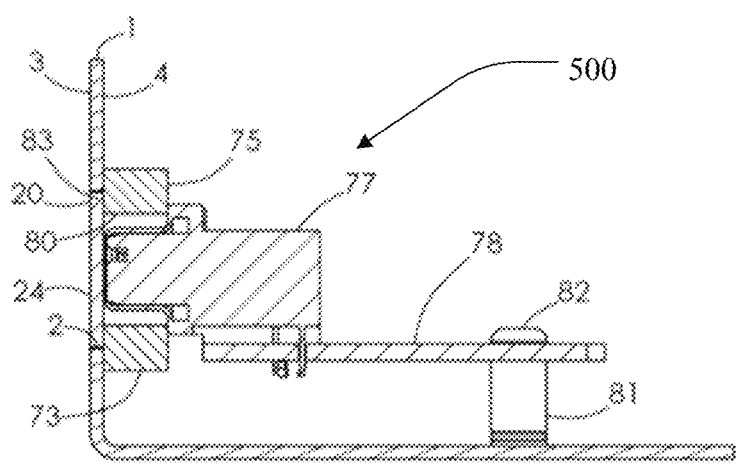
FIG. 20 is a side cross-sectional view of the recessed D-subminiature connector assembly of FIG. 17.
Figure 21:
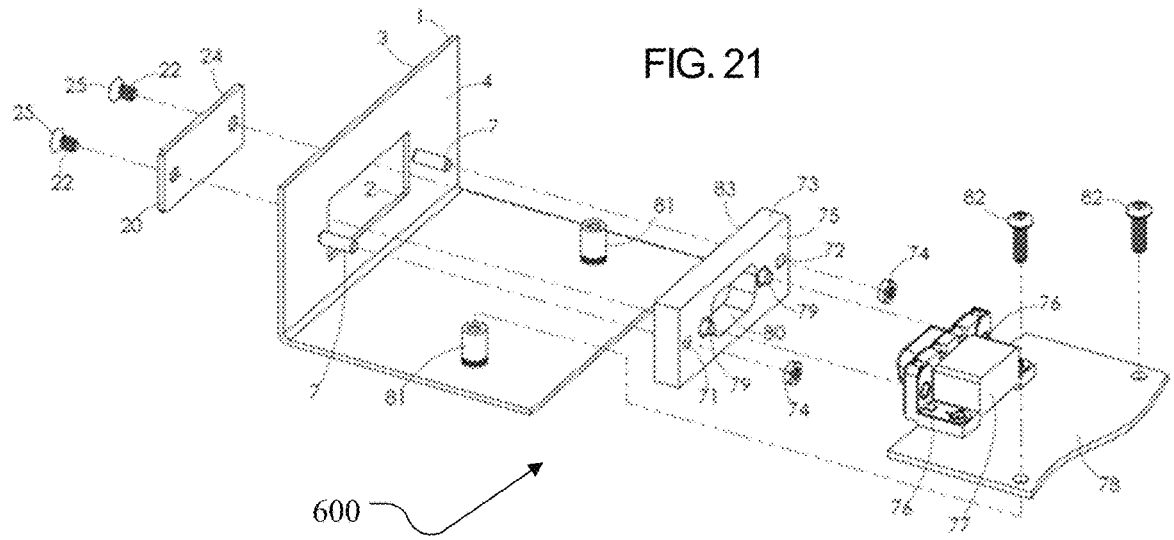
FIG. 21 illustrates an exploded view of a sixth embodiment of the recessed D-subminiature connector assembly with flush mount cover of FIG. 1.
Figure 22:
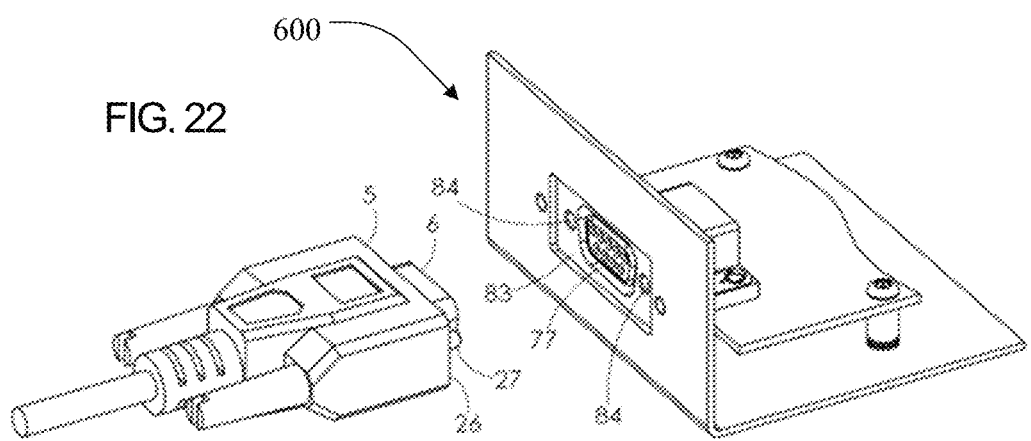
FIG. 22 shows the recessed D-subminiature connector assembly of FIG. 21 without the flush mount cover and aligned with a complementary male connector.
Figure 23:
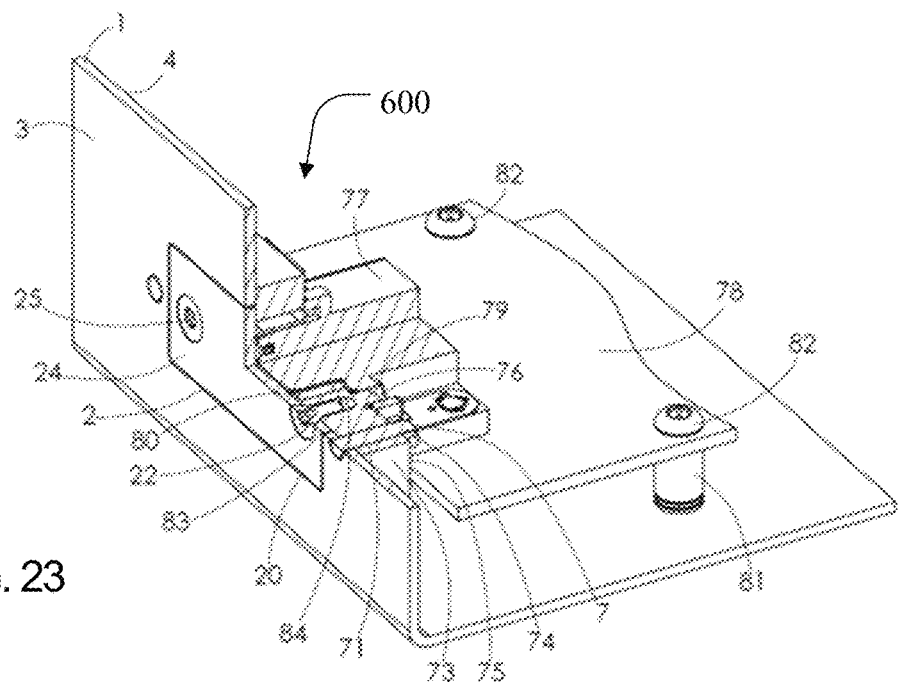
FIG. 23 is a sectional view of the recessed D-subminiature connector assembly of FIG. 21.
Figure 24:
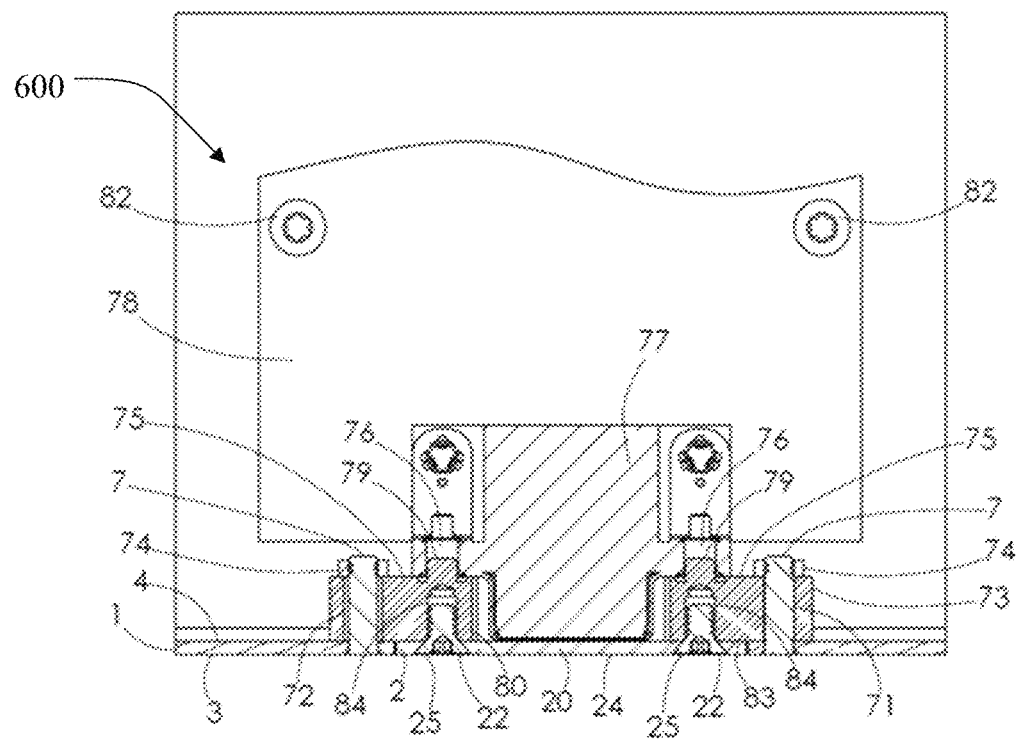
FIG. 24 is a top cross-sectional view of the recessed D-subminiature connector assembly of FIG. 21.
Figure 25:
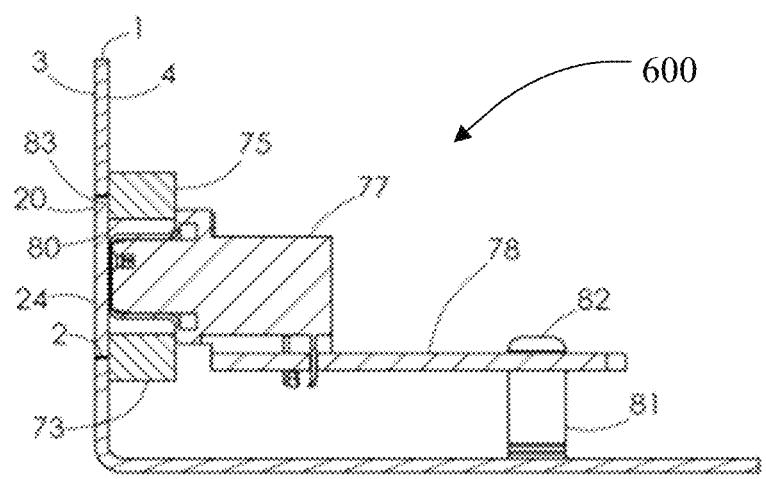
FIG. 25 is a side cross-sectional view of the recessed D-subminiature connector assembly of FIG. 21.
Figure 26:
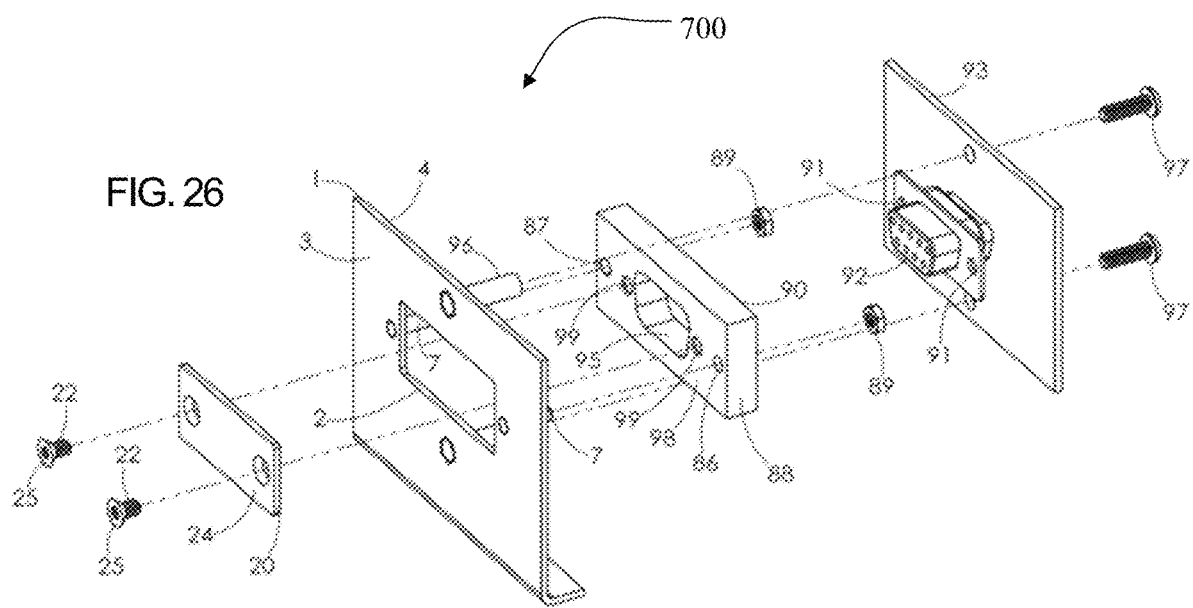
FIG. 26 illustrates an exploded view of a seventh embodiment of the recessed D-subminiature connector assembly with flush mount cover of FIG. 1.
Figure 27:
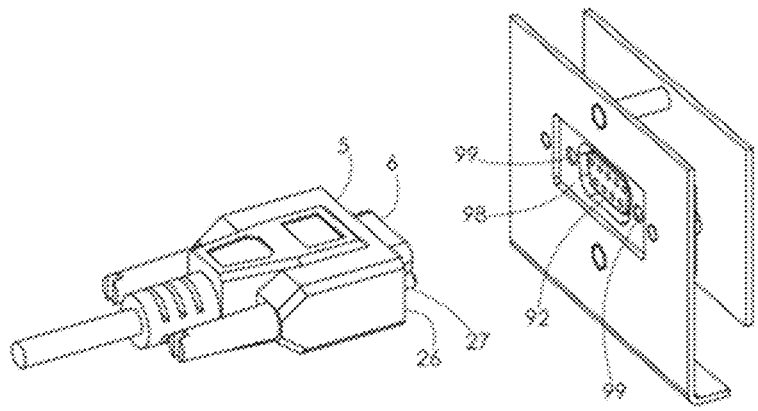
FIG. 27 shows the recessed D-subminiature connector assembly of FIG. 26 without the flush mount cover and aligned with a complementary male connector.
Figure 28:
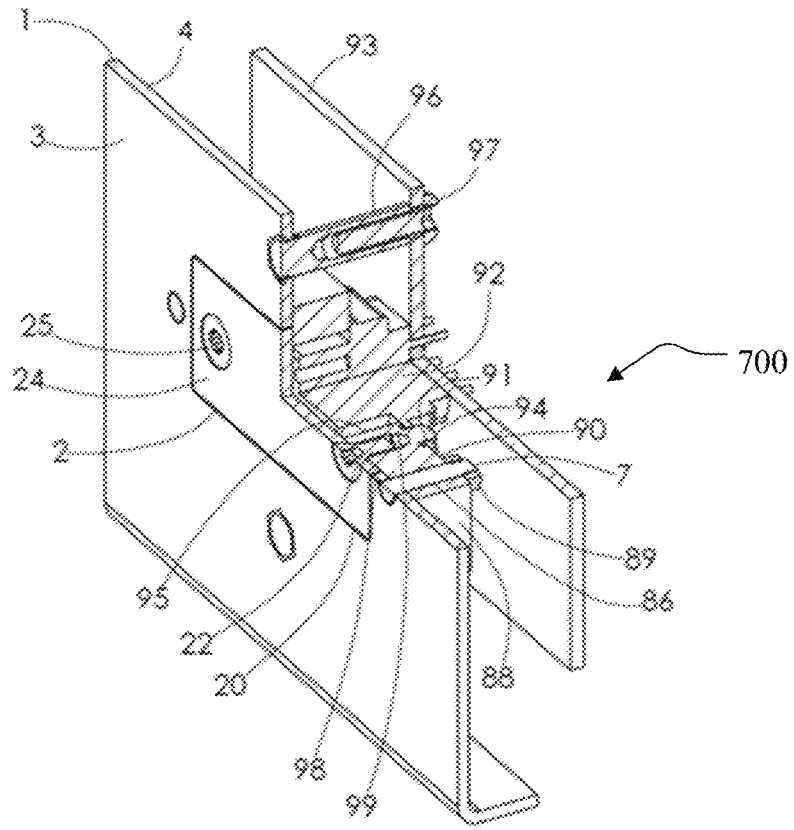
FIG. 28 is a sectional view of the recessed D-subminiature connector assembly of FIG. 26.
Figure 29:
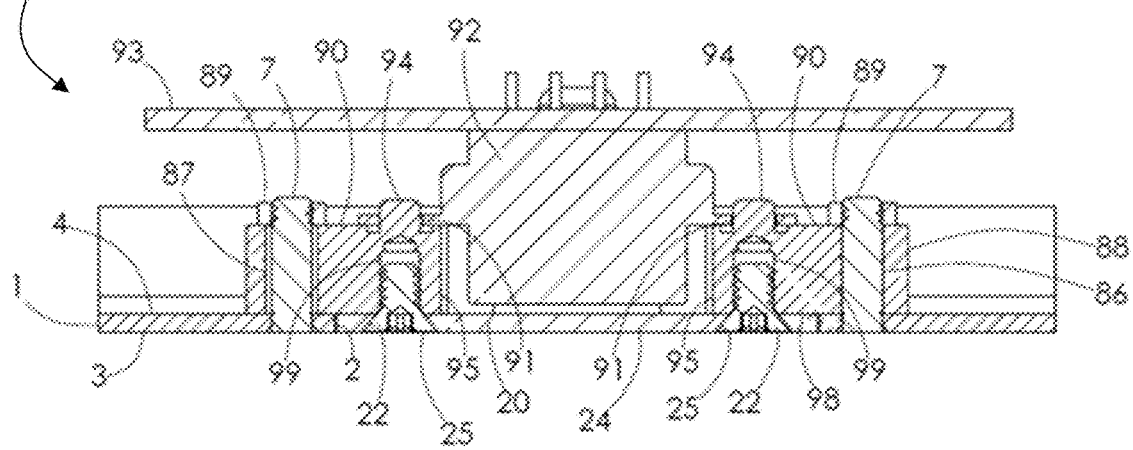
FIG. 29 is a top cross-sectional view of the recessed D-subminiature connector assembly of FIGS. 26-27.
Figure 30:
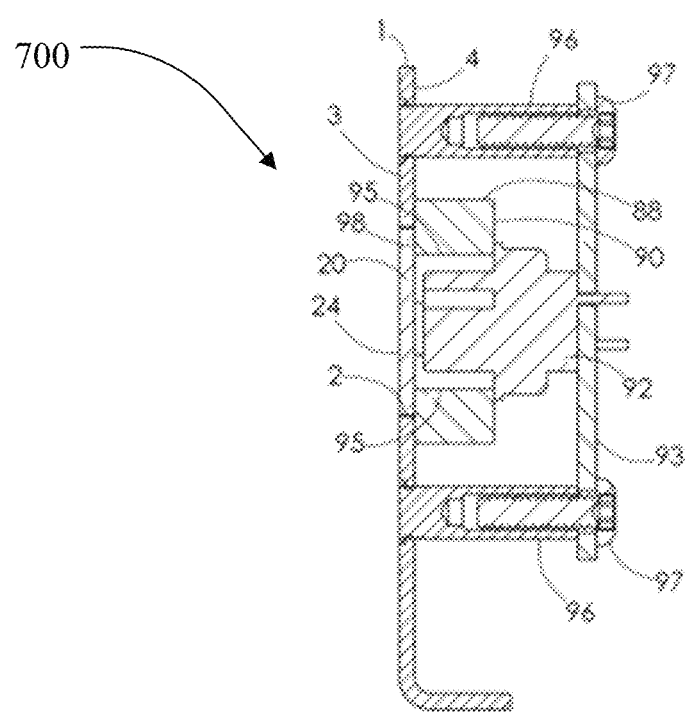
FIG. 30 is a side cross-sectional view of the recessed D-subminiature connector assembly of FIGS. 26-27.
Figure 31:
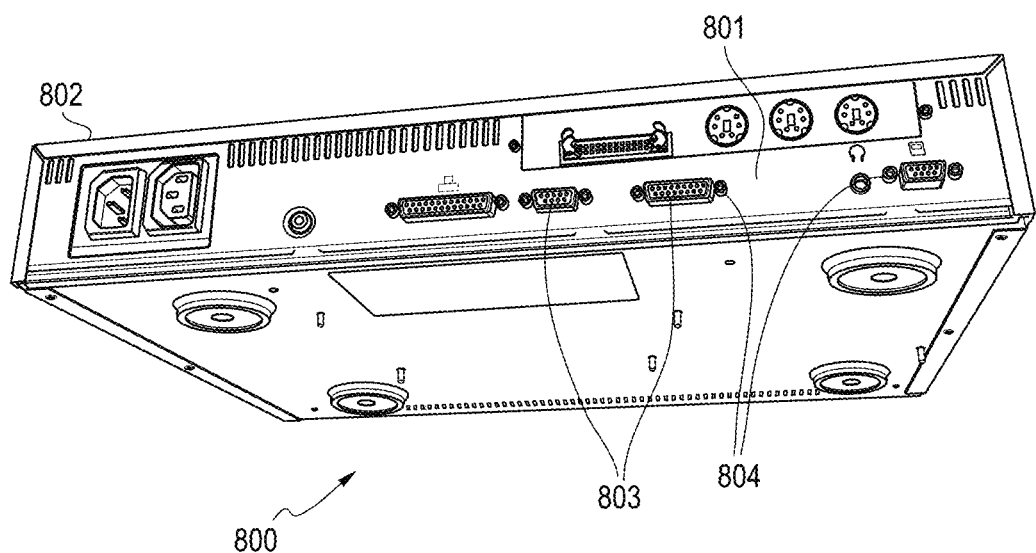
FIG. 31 illustrates a rear perspective view of a standard device showing a back panel of a housing with standard protruding D-subminiature connectors.
Figure 32:
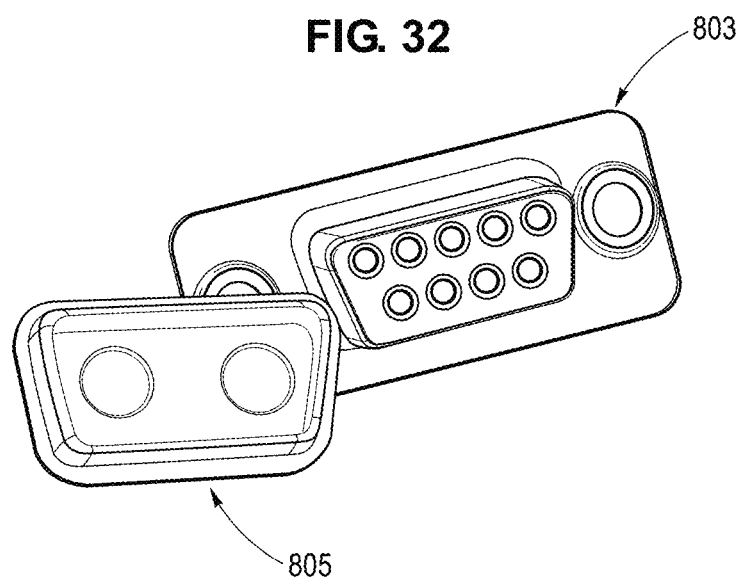
FIG. 32 illustrates a standard D-subminiature connector and dust cover.

It is contemplated that, in some instances, it may be desirable for the cover to be thicker than the panel. In a second embodiment, as illustrated in FIGS. 5-6, a D-Sub assembly 200 is shown with a thicker cover than panel thickness, but that still maintains the attached cover in a flush position with the outer surface of the panel. As shown in FIGS. 5-6, in this embodiment the inside surface 21 of the interface flange 10 can be recessed 28 to accept a thicker cover 29.

Third Embodiment

The first embodiment of a D-Sub assembly 100 of FIGS. 1-4 illustrates a thin panel design, such as a panel of sheet metal, extruded, or molded. The second embodiment of a D-Sub assembly 200 of FIGS. 5-6 illustrates a thicker cover than panel thickness. For other instances that do not use a thin sheet metal panel, for example a thicker machined, extruded, or molded panel, it may be desirable to incorporate the interface flange into the thicker panel. Referring to the third embodiment of a D-Sub assembly 300 shown in FIGS. 7-10, the thick panel 30 contains a panel opening 31 extending from the outside panel surface 32 to the panel interface flange 33. The panel opening 31 is large enough to accept the outside profile 5 of the mating D-Sub connector 6. The flange opening 34 extends from the panel interface flange 33 to inside panel surface 35. Internal threads 36 are positioned outside the flange opening 34 on the inside panel surface 35.

The D-Sub holes 11 on the D-Sub connector 12 mate with the alignment posts 13 on the rear mount 14. This provides the alignment of the D-Sub connector 12 to the rear mount 14. As noted previously, the D-Sub connector 12 could also be positioned to the rear mount 14 with other features on the D-Sub connector, such as the perimeter feature of the D-Sub connector, or the backside "D" feature of the D-Sub connector 12.

The alignment hole 15 and alignment slot 16 on the rear mount 14 align with the internal threads 36 on the inside panel surface 35 via the screws 37. This provides the alignment of the D-Sub connector 12 with rear mount 14 through the flange opening 34 to the panel opening 31. The D-Sub connector 12, could alternatively be positioned to the inside panel surface 35 with other features on the D-Sub connector, such as where the inside panel surface 35 could have protrusions to align with the D-Sub holes, or where the inside panel surface 35 could have a recess to receive the perimeter feature of the D-Sub connector. Screws 37 are assembled to the internal threads 36 and fastened up against the back 19 of the rear mount 14 mechanically fastening all the components up against the inside panel surface 35.

The cover 20 is placed in the panel opening 31 up against the panel interface flange 34. The cover 20 is assembled to the panel interface flange 33 with screws 22. The screws 22 mate with the internal threads 38 on the panel interface flange 33. After assembly, the outside surface 24 of the cover 20 is in the same plane as or recessed inside the outside panel surface 32. The screw heads 25 are in the same plane as or recessed below the outside surface 24 of the cover 20.

With the cover 20 and screws 22 removed, the mating D-Sub connector 6 can be inserted into the D-Sub connector 12. The mating D-Sub connector 6 is inserted into the D-Sub connector 12 until the outside surface 26 of the mating D-Sub connector 6 is flush with the panel interface flange 33. Once fully inserted the threaded posts 27 of the mating D-Sub connector 6 are fastened into the internal threads 38 on the panel interface flange 33.

Fourth Embodiment

Unlike the previous embodiments where the D-Sub connector assembly is shown as a panel mounted harness with discrete wires extending from the back of the D-Sub connector, some instances may require a straight or right-angle D-Sub connector mounted to a printed circuit board (PCB). An embodiment of a D-Sub connector assembly 400 for PCB mounting is illustrated in FIGS. 11-16. As shown in FIGS. 11-16, panel 1 contains a panel opening 2 extending from the outside panel surface 3 to the inside panel surface 4. The panel opening 2 is large enough to accept the outside profile 5 of the mating D-Sub connector 6.

Threaded studs 7 are positioned outside the panel opening 2. The alignment hole 39 and alignment slot 40 on interface flange 41 mate with the threaded studs 7 on the panel 1. This provides the alignment of the interface flange 41 to the panel opening 2 as the interface flange 41 is positioned up against the inside panel surface 4. In different implementations, the interface flange 41 could also be positioned to the panel with other features on the panel or interface flange. For example, the panel 1 could have a recess to receive protrusions from the interface flange 41, or the interface flange 41 could have a recess to receive protrusions from the panel 1. These protrusions and recesses may be cylindrical, square, rectangular or any other type of feature in which alignment could be achieved between the panel 1 and interface flange 41. Nuts 42 are assembled to the threaded studs 7 and fastened up against the recessed back 43 of the interface flange 41.

The D-Sub holes 44 on the D-Sub connector 45 mounted to the PCB 46 mate with the alignment posts 47 on the rear mount 48. This provides the alignment of the D-Sub connector 45 mounted to the PCB 46 to the rear mount 48. As noted in the prior embodiments, the D-Sub connector 45 could also be positioned to the rear mount 48 with other features on the D-Sub connector 45, such as the perimeter feature of the D-Sub connector, or the backside "D" feature of the D-Sub connector 45. The alignment hole 49 and alignment slot 50 on the rear mount 48 are aligned with the internal threads 51 on the interface flange 41 via the screws 52. This provides the alignment of the D-Sub connector 45 mounted to the PCB 46 with rear mount 48 through the interface flange opening 53 to the panel opening 2. The D-Sub connector 45 could also be positioned to the interface flange 41 with other features on the D-Sub connector 45 or interface plate, such as where the interface flange 41 could have protrusions to align with the D-Sub holes 44, or where the interface flange 41 could have a recess to receive the perimeter feature of the D-Sub connector 45.

The cover 20 is placed in the panel opening 2 up against the inside surface 54 of interface flange 41. The cover 20 is assembled to the interface flange 41 with screws 22. The screws 22 mate with the internal threads 55 of the interface flange 41. After assembly, the outside surface 24 of the cover 20 is in the same plane as or recessed inside the outside panel surface 3. The screw heads 25 are in the same plane as or recessed below the outside surface 24 of the cover 20.

With the cover 20 and screws 22 removed, the mating D-Sub connector 6 can be inserted into the D-Sub connector 45 mounted to the PCB 46. The mating D-Sub connector 6 is inserted into the D-Sub connector 45 until the outside surface 26 of the mating D-Sub connector 6 is flush with the inside surface 54 of the interface flange 41. Once fully inserted the threaded posts 27 of the mating D-Sub connector 6 are fastened into the internal threads 55 of the interface flange 41.

Fifth Embodiment

In an alternative embodiment from that of the D-Sub connector assembly 400 of FIGS. 11-16 showing straight PCB connection, the embodiment of FIGS. 17-20 a D-Sub connector assembly 500 with a right-angle D-Sub connector mounted to a PCB.

The panel 1 contains a panel opening 2 extending from the outside panel surface 3 to the inside panel surface 4. The panel opening 2 is large enough to accept the outside profile 5 of the mating D-Sub connector 6.

Threaded studs 7 are positioned outside the panel opening 2. The alignment hole 56 and alignment slot 57 on interface flange 58 mate with the threaded studs 7 on the panel 1. This provides the alignment of the interface flange 58 to the panel opening 2 as the interface flange 58 is positioned up against the inside panel surface 4. In different implementations, the interface flange 58 could also be positioned to the panel with other features on the panel 1 or interface flange 58. For example, the panel 1 could have a recess to receive protrusions from the interface flange 58, or the interface flange 58 could have a recess to receive protrusions from the panel 1. These protrusions and recesses may be cylindrical, square, rectangular or any other type of feature in which alignment could be achieved between the panel 1 and interface flange 58.

The D-Sub holes 59 on the D-Sub connector 60 mounted to the PCB 61 mate with the alignment posts 62 on the rear mount 63. This provides the alignment of the D-Sub connector 60 mounted to the PCB 61 to the rear mount 63. As noted in the prior embodiments, the D-Sub connector 60 could also be positioned to the rear mount 63 with other features on the D-Sub connector 60, such as the perimeter feature of the D-Sub connector, or the backside "D" feature of the D-Sub connector 60. The alignment hole 64 and alignment slot 65 on the rear mount 63 mate with the threaded studs 7 on the panel 1. This provides the alignment of the D-Sub connector 60 mounted to the PCB 61 with rear mount 63 through the interface flange opening 66 to the panel opening 2. The D-Sub connector 60 could also be positioned to the interface flange 66 with other features on the D-Sub connector 60 or interface plate, such as where the interface flange 66 could have protrusions to align with the D-Sub holes 59, or where the interface flange 66 could have a recess to receive the perimeter feature of the D-Sub connector 45. Nuts 67 are assembled to the threaded studs 7 and fastened up against the back 68 of the rear mount 63 mechanically fastening all the components up against the inside panel surface 4.

The cover 20 is placed in the panel opening 2 up against the inside surface 69 of interface flange 58. The cover 20 is assembled to the interface flange 58 with screws 22. The screws 22 mate with the internal threads 70 of the interface flange 58. After assembly, the outside surface 24 of the cover 20 is in the same plane as or recessed inside the outside panel surface 3. The screw heads 25 are in the same plane as or recessed below the outside surface 24 of the cover 20.

With the cover 20 and screws 22 removed, the mating D-Sub connector 6 can be inserted into the D-Sub connector 60 mounted to the PCB 61. The mating D-Sub connector 6 is inserted into the D-Sub connector 60 until the outside surface 26 of the mating D-Sub connector 6 is flush with the inside surface 69 of the interface flange 58. Once fully inserted the threaded posts 27 of the mating D-Sub connector 6 are fastened into the internal threads 70 of the interface flange 58.

Sixth Embodiment

In an alternative embodiment from that of the D-Sub connector assembly 500 of FIGS. 17-20, the embodiment of FIGS. 21-25 illustrates a D-Sub connector assembly 600 with a right-angle D-Sub connector mounted to a PCB to be wedged up against the interface flange. This scenario contemplates the PCB with D-Sub to be mechanically fastened down to a chassis or other mounting feature. The panel 1 contains a panel opening 2 extending from the outside panel surface 3 to the inside panel surface 4. The panel opening 2 is large enough to accept the outside profile 5 of the mating D-Sub connector 6.

Threaded studs 7 are positioned outside the panel opening 2. The alignment hole 71 and alignment slot 72 on interface flange 73 mate with the threaded studs 7 on the panel 1. This provides the alignment of the interface flange 73 to the panel opening 2 as the interface flange 73 is positioned up against the inside panel surface 4. In different implementations, the interface flange 73 could also be positioned to the panel with other features on the panel or interface flange. For example, the panel 1 could have a recess to receive protrusions from the interface flange 73, or the interface flange 73 could have a recess to receive protrusions from the panel 1. These protrusions and recesses may be cylindrical, square, rectangular or any other type of feature in which alignment could be achieved between the panel 1 and interface flange 73. Nuts 74 are assembled to the threaded studs 7 and fastened up against the back 75 of the interface flange 73 mechanically fastening the interface flange 73 up against the inside panel surface 4.

The D-Sub connector 77 mounted to the PCB 78 is wedged up against the back 75 of the interface flange 73 as the D-Sub holes 76 mate with the alignment posts 79 on the interface flange 73. This provides the alignment of the D-Sub connector 77 mounted to the PCB 78 to the interface flange 73. Alternatively, D-Sub connector 77 could also be positioned to the interface flange 73 with other features on the D-Sub connector, such as the perimeter feature of the D-Sub connector 77. This also provides the alignment of the D-Sub connector 77 through the interface flange opening 80 to the panel opening 2. The PCB 78 is mechanically fastened to the chassis standoffs 81 via screws 82. The PCB 78 could also be mechanically fastened using a threaded stud through a PCB mounting hole on the board and fastening with a nut in another implementation. Alternatively, the PCB 78 may be mechanically fastened to a mounting feature such as a flat surface, another PCB using standoffs, internal threaded, or threaded stud, or another PCB using electrical interface connectors.

The cover 20 is placed in the panel opening 2 up against the inside surface 83 of interface flange 73. The cover 20 is assembled to the interface flange 73 with screws 22. The screws 22 mate with the internal threads 84 of the interface flange 73. After assembly, the outside surface 24 of the cover 20 is in the same plane as or recessed inside the outside panel surface 3. The screw heads 25 are in the same plane as or recessed below the outside surface 24 of the cover 20.

With the cover 20 and screws 22 removed, the mating D-Sub connector 6 can be inserted into the D-Sub connector 77 mounted to the PCB 78. The mating D-Sub connector 6 is inserted into the D-Sub connector 77 until the outside surface 26 of the mating D-Sub connector 6 is flush with the inside surface 83 of the interface flange 73. Once fully inserted the threaded posts 27 of the mating D-Sub connector 6 are fastened into the internal threads 84 of the interface flange 73.

Seventh Embodiment

In an alternative embodiment, shown in FIGS. 26-30, illustrates a D-Sub connector assembly 700 with a straight D-Sub connector mounted to a PCB to be wedged up against the interface flange. As in the sixth embodiment above, this scenario contemplates the PCB with D-Sub to be mechanically fastened down to a chassis or other mounting feature.

In FIGS. 26-30, the panel 1 contains a panel opening 2 extending from the outside panel surface 3 to the inside panel surface 4. The panel opening 2 is large enough to accept the outside profile 5 of the mating D-Sub connector 6.

Threaded studs 7 are positioned outside the panel opening 2. The alignment hole 86 and alignment slot 87 on interface flange 88 mate with the threaded studs 7 on the panel 1. This provides the alignment of the interface flange 88 to the panel opening 2 as the interface flange 88 is positioned up against the inside panel surface 4. In different implementations, the interface flange 88 could also be positioned to the panel 1 with other features on the panel 1 or interface flange 88. For example, the panel 1 could have a recess to receive protrusions from the interface flange 88, or the interface flange 88 could have a recess to receive protrusions from the panel 1. These protrusions and recesses may be cylindrical, square, rectangular or any other type of feature in which alignment could be achieved between the panel 1 and interface flange 88. Nuts 89 are assembled to the threaded studs 7 and fastened up against the back 90 of the interface flange 88 mechanically fastening the interface flange 88 up against the inside panel surface 4.

The D-Sub connector 92 mounted to the PCB 93 is wedged up against the back 90 of the interface flange 88 as the D-Sub holes 91 mate with the alignment posts 94 on the interface flange 88. This provides the alignment of the D-Sub connector 92 mounted to the PCB 93 to the interface flange 88. Alternatively, the D-Sub connector 92 could also be positioned to the interface flange 88 with other features on the D-Sub connector, such as the perimeter feature of the D-Sub connector 92. This also provides the alignment of the D-Sub connector 92 through the interface flange opening 95 to the panel opening 2. The PCB 93 is mechanically fastened to the panel standoffs 96 via screws 97. The PCB 78 could also be mechanically fastened using a threaded stud through a PCB mounting hole on the board and fastening with a nut in another implementation. Alternatively, the PCB 78 may be mechanically fastened to an alternate mounting feature such as a flat surface, another PCB using standoffs, internal threaded, or threaded stud, or another PCB using electrical interface connectors.

The cover 20 is placed in the panel opening 2 up against the inside surface 98 of interface flange 88. The cover 20 is assembled to the interface flange 88 with screws 22. The screws 22 mate with the internal threads 99 of the interface flange 88. After assembly, the outside surface 24 of the cover 20 is in the same plane as or recessed inside the outside panel surface 3. The screw heads 25 are in the same plane as or recessed below the outside surface 24 of the cover 20.

With the cover 20 and screws 22 removed, the mating D-Sub connector 6 can be inserted into the D-Sub connector 92 mounted to the PCB 93. The mating D-Sub connector 6 is inserted into the D-Sub connector 92 until the outside surface 26 of the mating D-Sub connector 6 is flush with the inside surface 98 of the interface flange 88. Once fully inserted the threaded posts 27 of the mating D-Sub connector 6 are fastened into the internal threads 99 of the interface flange 88.

Although the present invention has been described with reference to several exemplary embodiments, those skilled in the art will recognize that changes may be made in form and detail without departing from the spirit and scope of the invention. For example, the illustrated connection type of a D-sub connector integrated into the disclosed assembly illustrates the pin receptacle, or female, portion of the complete connection, but embodiments are contemplated where the multiple pin side, or male side, of the connection is instead held in the same recessed manner in the housing by the assembly. Similarly, other types of connectors other than the D-Sub connector type may be arranged in the disclosed recessed opening arrangement with flush mount cover in different embodiments. As such, it is intended that the foregoing detailed description be regarded as illustrative rather than limiting and that it is the appended claims, including all equivalents thereof, which are intended to define the scope of the invention.

What is claimed is:

1. A D-shaped connector assembly for installation in an opening of a panel of a device comprising:
    a D-shaped connector body having a plurality of conducting leads located on a first side and a plurality of connector pin receptacles positioned on a second side;
    a panel-side interface flange having an opening sized to receive the second side of the D-shaped connector and wherein a surface of the second side of the D-shaped connector is parallel to, and recessed from, a plane of the panel-side interface flange when the D-shaped connector body is connected to the panel-side interface flange and attached to the panel in the opening of the panel of the device; and
    a connector cover removably attachable over the D-shaped connector body in a recessed region defined by the opening of the panel and the panel-side interface flange attached to the device such that, in an attached position, the connector cover is substantially flush with an outer surface of the panel of the device
    wherein the panel-side interface flange is removably attachable of an interior surface of the panel via alignment guides;
    wherein the alignment guides of the panel-side interface flange comprise mounting holes extending therethrough, parallel to the opening sized to receive the second side of the D-shaped connector body;
    wherein a rear mount having a shape sized to receive the first side of the D-shaped connector body and contact at least a portion of a flange extends circumferentially around the D-shaped connector body.

2. The D-shaped connector assembly of claim 1, wherein the connector cover is thicker than a thickness of the panel of the device.

3. The D-shaped connector assembly of claim 1, wherein the rear mount has an inner circumference that completely surrounds an outer circumference of the first side of the D-shaped connector body.

4. The D-shaped connector assembly of claim 1, wherein the rear mount comprises an alignment post extending from a surface of the rear mount and sized to mate with an alignment hole in the flange of the D-shaped connector body such that the first side of the D-shaped connector and the rear mount connect in a predetermined alignment.

5. The D-shaped connector assembly of claim 1, wherein the D-shaped connector body is removably captured between the panel-side interface flange and the rear mount, and the panel-side interface flange and rear mount are removably connectable to the panel via the mounting holes in the panel-side interface flange and through rear mount mounting holes on the rear mount that are aligned with the mounting holes of the panel-side interface flange.

6. The D-shaped connector assembly of claim 1, wherein the plurality of conducting leads located on a first side of the connector body are oriented in a direction perpendicular to the plurality of connector pin receptacles positioned on the second side.

7. A device having a recessed D-shaped connector assembly, the device comprising:
    a device housing having a panel defining a connector opening; and
    a D-shaped connector mounted to the panel at the connector opening, wherein the D-shaped connector comprises:
        a D-shaped connector body having a plurality of conducting leads located on a first side and a plurality of connector pin receptacles positioned on a second side; and
        a panel-side interface flange having an opening sized to receive the second side of the D-shaped connector and wherein a surface of the second side of the D-Shaped connector is parallel to, and recessed from, a plane of the panel-side interface flange, when the D-shaped connector body is connected to the panel-side interface flange and attached to the housing adjacent the connector opening in the panel such that the second side of the D-Shaped connector is maintained in a position recessed from the connector opening;
        wherein the panel-side interface flange comprises mounting holes extending therethrough parallel to the opening sized to receive the second side of the D-shaped connector body;
        wherein a rear mount having a shape sized to receive the first side of the D-shaped connector body and contact at least a portion of a flange extends circumferentially around the D-shaped connector body;
        wherein the rear mount has an inner circumference that completely surrounds an outer circumference of the first side of the D-shaped connector body.

8. The device of claim 7, further comprising a connector cover removably attachable over the D-shaped connector body in a recessed region of the connector opening, the recessed region defined between an outer surface of the panel and the panel-side interface flange attached to the panel such that, in an attached position, the connector cover is substantially flush with the outer surface of the panel.

9. The device of claim 7, wherein the rear mount comprises an alignment post extending from a surface of the rear mount and sized to mate with an alignment hole in the flange of the D-shaped connector body such that the first side of the D-shaped connector and the rear mount connect in a predetermined alignment.

10. The device of claim 7, wherein the D-shaped connector body is removably captured between the panel-side interface flange and the rear mount, and the panel-side interface flange and rear mount are removably connectable to the panel via the mounting holes in the panel-side interface flange and through rear mount mounting holes on the rear mount that are aligned with the mounting holes of the panel-side interface flange.

11. The device of claim 7, further comprising:
a printed circuit board oriented parallel to the panel and connected to the plurality of conducting leads located on the first side of the D-shaped connector body; and
wherein the D-shaped connector body is removably attached to the panel-side interface flange via a first fastener and the panel-side interface flange is removably attached to the panel via a second fastener.

12. The device of claim 7, further comprising:
a printed circuit board oriented perpendicular to the connector, connected to the plurality of conducting leads located on the first side of the D-shaped connector body and connected to the housing via a first fastener; and
wherein the D-shaped connector body and the panel-side interface flange are removably attached to the panel via a common fastener.

13. The device of claim 7, wherein the D-shaped connector body is removably attached to the printed circuit board via at least one fastener.

14. The device of claim 12, further comprising a rear mount sized to contact at least a portion of a flange of the D-shaped connector body on the first side of the D-shaped connector body, wherein the D-shaped connector body is captured between the rear mount and the panel-side interface flange, and wherein the common fastener extends through the panel-side interface flange, the flange of the D-shaped connector body and the rear mount.

15. A device having a recessed D-shaped connector assembly, the device comprising:
a device housing having a panel defining a connector opening; and
a D-shaped connector mounted to the panel at the connector opening, wherein the D-shaped connector comprises:
a D-shaped connector body having a plurality of conducting leads located on a first side and a plurality of connector pin receptacles positioned on a second side; and
a panel-side interface flange having an opening sized to receive the second side of the D-shaped connector and wherein a surface of the second side of the D-Shaped connector is parallel to, and recessed from, a plane of the panel-side interface flange, when the D-shaped connector body is connected to the panel-side interface flange and attached to the housing adjacent the connector opening in the panel such that the second side of the D-Shaped connector is maintained in a position recessed from the connector opening;
wherein the panel-side interface flange comprises mounting holes extending therethrough parallel to the opening sized to receive the second side of the D-shaped connector body;
wherein a rear mount having a shape sized to receive the first side of the D-shaped connector body and contact at least a portion of a flange extends circumferentially around the D-shaped connector body;
wherein the rear mount comprises an alignment post extending from a surface of the rear mount and sized to mate with an alignment hole in the flange of the D-shaped connector body such that the first side of the D-shaped connector and the rear mount connect in a predetermined alignment.

16. The device of claim 15, further comprising a connector cover removably attachable over the D-shaped connector body in a recessed region of the connector opening, the recessed region defined between an outer surface of the panel and the panel-side interface flange attached to the panel such that, in an attached position, the connector cover is substantially flush with the outer surface of the panel.

17. The device of claim 15, wherein the D-shaped connector body is removably captured between the panel-side interface flange and the rear mount, and the panel-side interface flange and rear mount are removably connectable to the panel via the mounting holes in the panel-side interface flange and through rear mount mounting holes on the rear mount that are aligned with the mounting holes of the panel-side interface flange.

18. The device of claim 15, further comprising:
a printed circuit board oriented parallel to the panel and connected to the plurality of conducting leads located on the first side of the D-shaped connector body; and
wherein the D-shaped connector body is removably attached to the panel-side interface flange via a first fastener and the panel-side interface flange is removably attached to the panel via a second fastener.

19. The device of claim 15, further comprising:
a printed circuit board oriented perpendicular to the connector, connected to the plurality of conducting leads located on the first side of the D-shaped connector body and connected to the housing via a first fastener; and
wherein the D-shaped connector body and the panel-side interface flange are removably attached to the panel via a common fastener.

20. The device of claim 15, wherein the D-shaped connector body is removably attached to the printed circuit board via at least one fastener.

21. The device of claim 19, further comprising a rear mount sized to contact at least a portion of a flange of the D-shaped connector body on the first side of the D-shaped connector body, wherein the D-shaped connector body is captured between the rear mount and the panel-side interface flange, and wherein the common fastener extends through the panel-side interface flange, the flange of the D-shaped connector body and the rear mount.

22. A device having a recessed D-shaped connector assembly, the device comprising:
a device housing having a panel defining a connector opening; and
a D-shaped connector mounted to the panel at the connector opening, wherein the D-shaped connector comprises:

a D-shaped connector body having a plurality of conducting leads located on a first side and a plurality of connector pin receptacles positioned on a second side; and a panel-side interface flange having an opening sized to receive the second side of the D-shaped connector and wherein a surface of the second side of the D-Shaped connector is parallel to, and recessed from, a plane of the panel-side interface flange, when the D-shaped connector body is connected to the panel-side interface flange and attached to the housing adjacent the connector opening in the panel such that the second side of the D-Shaped connector is maintained in a position recessed from the connector opening;

wherein the panel-side interface flange comprises mounting holes extending therethrough parallel to the opening sized to receive the second side of the D-shaped connector body;

wherein a rear mount having a shape sized to receive the first side of the D-shaped connector body and contact at least a portion of a flange extends circumferentially around the D-shaped connector body;

wherein the D-shaped connector body is removably captured between the panel-side interface flange and the rear mount, and the panel-side interface flange and rear mount are removably connectable to the panel via the mounting holes in the panel-side interface flange and through rear mount mounting holes on the rear mount that are aligned with the mounting holes of the panel-side interface flange.

23. The device of claim 22, further comprising a connector cover removably attachable over the D-shaped connector body in a recessed region of the connector opening, the recessed region defined between an outer surface of the panel and the panel-side interface flange attached to the panel such that, in an attached position, the connector cover is substantially flush with the outer surface of the panel.

24. The device of claim 22, further comprising:
a printed circuit board oriented parallel to the panel and connected to the plurality of conducting leads located on the first side of the D-shaped connector body; and
wherein the D-shaped connector body is removably attached to the panel-side interface flange via a first fastener and the panel-side interface flange is removably attached to the panel via a second fastener.

25. The device of claim 22, further comprising:
a printed circuit board oriented perpendicular to the connector, connected to the plurality of conducting leads located on the first side of the D-shaped connector body and connected to the housing via a first fastener; and
wherein the D-shaped connector body and the panel-side interface flange are removably attached to the panel via a common fastener.

26. The device of claim 22, wherein the D-shaped connector body is removably attached to the printed circuit board via at least one fastener.

27. The device of claim 25, further comprising a rear mount sized to contact at least a portion of a flange of the D-shaped connector body on the first side of the D-shaped connector body, wherein the D-shaped connector body is captured between the rear mount and the panel-side interface flange, and wherein the common fastener extends through the panel-side interface flange, the flange of the D-shaped connector body and the rear mount.

* * * * *